United States Patent
Eadala et al.

(10) Patent No.: US 10,508,537 B2
(45) Date of Patent: Dec. 17, 2019

(54) ADAPTIVE EQUALISATION

(71) Applicant: E.V. Offshore Limited, Norwich (GB)

(72) Inventors: Sumanth Eadala, Norwich (GB); Jonathan Thursby, Norwich (GB)

(73) Assignee: E.V. OFFSHORE LIMITED, Norwich (GB)

( * ) Notice: Subject to any disclaimer, the term of this patent is extended or adjusted under 35 U.S.C. 154(b) by 0 days.

(21) Appl. No.: 15/869,901

(22) Filed: Jan. 12, 2018

(65) Prior Publication Data

US 2018/0245457 A1    Aug. 30, 2018

(51) Int. Cl.
| | |
|---|---|
| *E21B 47/12* | (2012.01) |
| *H04L 25/03* | (2006.01) |
| *H04L 27/148* | (2006.01) |
| *H04L 27/34* | (2006.01) |
| *H03H 21/00* | (2006.01) |

(52) U.S. Cl.
CPC .......... *E21B 47/12* (2013.01); *H04L 25/0305* (2013.01); *H04L 25/03019* (2013.01); *H04L 25/03885* (2013.01); *H04L 27/148* (2013.01); *H04L 27/34* (2013.01); *H03H 2021/0092* (2013.01); *H04L 2025/03636* (2013.01)

(58) Field of Classification Search
CPC ............... E21B 47/12; H04L 25/03019; H04L 25/0305; H04L 25/03885; H04L 27/148; H04L 27/34; H04L 2025/03636; H03H 2021/0092
See application file for complete search history.

(56) References Cited

U.S. PATENT DOCUMENTS

| | | |
|---|---|---|
| 5,471,504 A | 11/1995 | Lee et al. |
| 8,174,786 B1 | 5/2012 | Song |
| 9,450,788 B1 | 9/2016 | Cops et al. |
| 2003/0099289 A1 | 5/2003 | Birru |
| 2004/0057513 A1 | 3/2004 | Schenk |
| 2008/0037622 A1 | 2/2008 | Kohyama |
| 2008/0130733 A1* | 6/2008 | Ogawa .................. H04B 1/707 375/232 |

FOREIGN PATENT DOCUMENTS

EP       1380144 B1    3/2005

OTHER PUBLICATIONS

Dick et al, "FPGA Implementation of Carrier Synchronization for QAM Receivers", Journal of VLSI Signal Processing vol. 36, No. 1, pp. 57-71, 2004 (Year: 2004).*

* cited by examiner

*Primary Examiner* — Amine Benlagsir
(74) *Attorney, Agent, or Firm* — Hayes Soloway PC

(57) ABSTRACT

This invention is designed for use in transmission of data between downhole module in a wellbore and a controlling module at the surface. The invention provides an apparatus for receiving data signals from a telemetry module comprising first and second adaptive equalisers, and in which in a first modulation mode the coefficients of the first adaptive equaliser are updated until an error signal falls below a predetermined threshold and in a second modulation mode the coefficients of the first adaptive equaliser are locked and coefficients of the second adaptive equaliser are updated to continually minimise an error signal in which the number of bits encoded by the symbols of the first signal in an initial modulation mode is fewer than the number of bits encoded by the symbols of the second signal in a subsequent modulation mode.

10 Claims, 8 Drawing Sheets

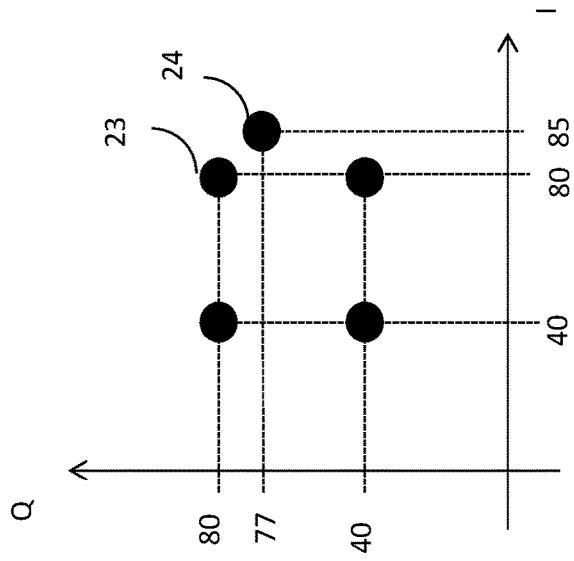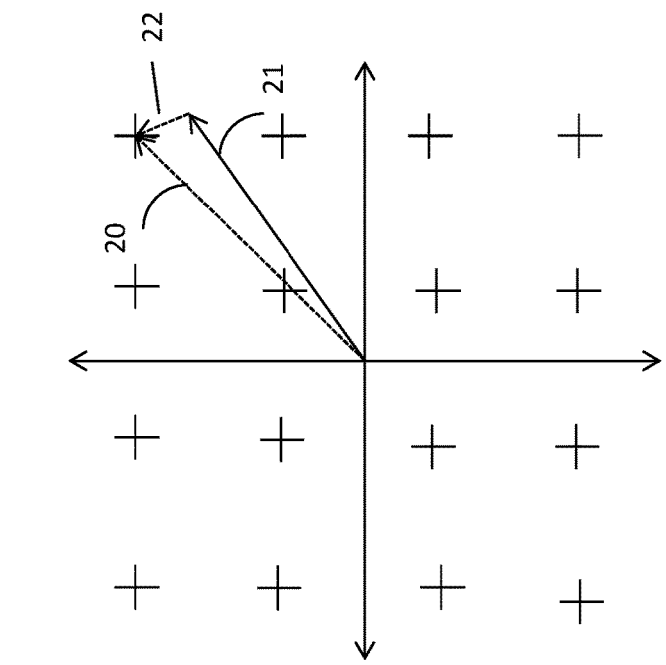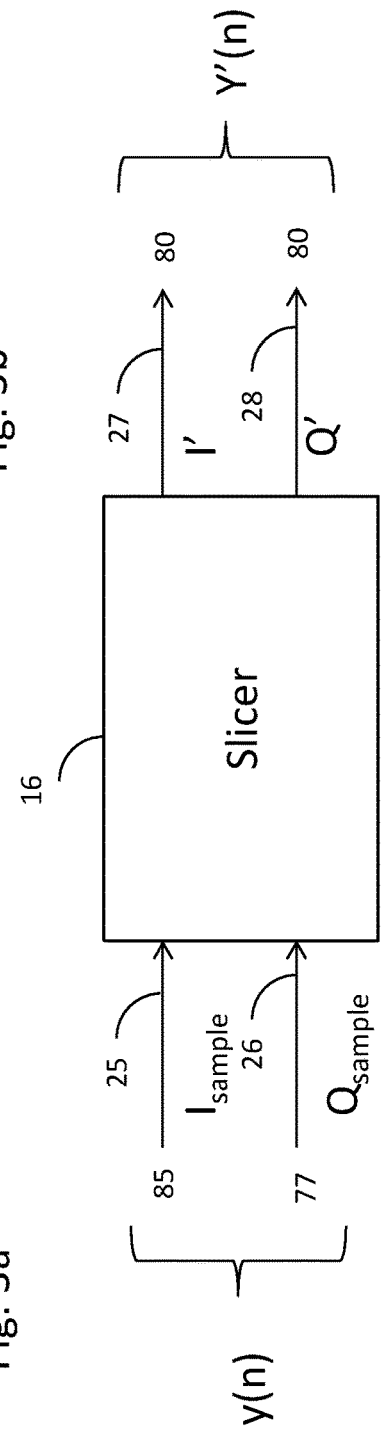
Fig. 3a
Fig. 3b
Fig. 3c

ADAPTIVE EQUALISATION

CROSS-REFERENCE TO RELATED APPLICATIONS

This patent application claims the benefit of and priority to UK Patent Application No. 1701713.8, filed on Feb. 2, 2017. The disclosure of this patent application is herein incorporated by reference in its entirety.

BACKGROUND a. Field of the Invention

The present invention relates to inspection apparatus for use in wellbores in the oil and gas industries. In particular the invention relates in general to the field of transmission of data between downhole module in a wellbore and a controlling module at the surface.

b. Related Art

Accurate collection of geophysical data is a key to successful exploration and production in oil and gas industries. Based on data collected in a wellbore it is possible to determine whether a well is likely to be productive, and decisions can be made such as whether to drill additional wells near an existing well or whether to abandon a well as being unproductive.

Collecting wellbore data is known as well-logging. In well-logging, a telemetry module is lowered into a wellbore on a cable containing an inner core of insulated wire known as a wireline cable. The wireline cable provides power to equipment located at the end of the cable, and provides a pathway for electrical telemetry for communication between the surface and the telemetry module at the end of the cable.

The telemetry module is an electrically powered measurement device for inspecting the wellbore and is connected to a surface controller via the wireline cable.

Electrical digital and data control signals are transmitted between the surface controller and the downhole telemetry module via one or more conductors in the wireline cable. Downstream data signals are used to remotely control the functions of various downhole devices such as one or more cameras, motor tools to rotate a part of the module and to configure parameters for sensors such as temperature & pressure sensors, accelerometers and gyroscopes.

Upstream data signals transmit information from the telemetry module to the controller such as images, information indicative of the operation of the downhole devices or parameters detected or measured by the sensors.

The wellbore depth and hence the distance between the telemetry module and the surface controller may be many thousands of feet. Temperatures in the wellbore may rise to over 100 degrees Centigrade. The wireline cable must be designed to withstand the physical conditions and to sustain the weight of the telemetry module complete with tools connected beneath it and the length of the wireline cable as the telemetry module is lowered into the wellbore. The wireline cable is not primarily designed as a communications channel for efficiently transmitting modulated data signals and therefore the channel frequency response of the cable is not optimised for efficient data transmission.

The present invention reduces errors in a received signal by using a two stage adaptive equalisation scheme.

Although the present invention is designed for us in telemetry apparatus for use in wellbores it is not restricted to such use and will be advantageous in other fields of operation where improved signal decoding in a noisy environment would be beneficial.

SUMMARY OF THE INVENTION

This invention is designed for use in transmission of data between downhole module in a wellbore and a controlling module at the surface. The invention provides an apparatus for receiving data signals from a telemetry module comprising first and second adaptive equalisers, and in which in a first modulation mode the coefficients of the first adaptive equaliser are updated until an error signal falls below a predetermined threshold and in a second modulation mode the coefficients of the first adaptive equaliser are locked and coefficients of the second adaptive equaliser are updated to continually minimise an error signal in which the number of bits encoded by the symbols of the first signal in an initial modulation mode is fewer than the number of bits encoded by the symbols of the second signal in a subsequent modulation mode.

The invention provides a method of adaptive equalisation comprising the steps of: receiving a first signal transmitted via a channel in which the first received signal differs from the first transmitted signal due to channel distortion and/or noise, the first signal comprising a sequence of symbols encoded by inphase and quadrature components; repeating the steps of filtering a portion of the received first signal using a first filter having a plurality of first filter coefficients; determining the likely inphase and quadrature components of the first transmitted signal; determining a first error signal in dependence upon the difference between the likely inphase and quadrature components and the received inphase and quadrature components; updating the first filter coefficients to reduce said first error signal; until the average first error signal is less than a predetermined threshold; and the method further comprises receiving a second signal transmitted via a channel in which the second received signal differs from the second transmitted signal due to channel distortion and/or noise, the second signal comprising a sequence of symbols encoded by inphase and quadrature components; continually repeating the steps of filtering a portion of the received second signal using said first filter to obtain a first filtered second signal; filtering the first filtered second signal using a second filter having a plurality of second filter coefficients; determining the likely inphase and quadrature components of the second transmitted signal; determining a second error signal in dependence upon the difference between the likely inphase and quadrature components and the received inphase and quadrature components; updating the second filter coefficients to reduce second error signal; and wherein the number of bits encoded by the symbols of the first signal in an initial modulation mode is fewer than the number of bits encoded by the symbols of the second signal in a subsequent modulation mode.

Preferably the first signal comprises a QPSK signal. Preferably the second signal is a QAM 16 signal.

In a preferred embodiment the likely inphase and quadrature components of the originally transmitted signal are determined by using a least means squares algorithm.

In a preferred embodiment the first and second filter coefficients are updated in dependence upon the first and second error signals respectively together with a factor which is greater than zero and less than 1/input signal power multiplied by the no. of filter taps in the respective filter.

The invention also includes a method of QAM demodulation including such a method of adaptive equalisation.

According to a further aspect of the invention there is provided an apparatus for receiving data signals from a telemetry module comprising: a first adaptive equaliser for receiving a signal transmitted via a channel in which the received signal differs from the transmitted signal due to channel distortion and/or noise, the signal comprising a sequence of symbols encoded by inphase and quadrature components; the first adaptive equaliser comprising: a first filter for filtering a portion of the received signal using a first filter having a plurality of first filter coefficients; a first slicer for determining the likely inphase and quadrature components of the first transmitted signal; a first error calculator for determining a first error signal in dependence upon the difference between the likely inphase and quadrature components and the received inphase and quadrature components; and a first coefficient updater for updating the first filter coefficients to reduce said first error signal when the received signal is encoded by the initial modulation and until the average first error signal is less than a predetermined threshold; and a second filter for filtering a portion of the a first filtered signal received from the first filter using a second filter having a plurality of second filter coefficients; a second slicer for determining the likely inphase and quadrature components of the second transmitted signal; a second error calculator for determining a second error signal in dependence upon the difference between the likely inphase and quadrature components and the received inphase and quadrature components; and a second coefficient updater for updating the second filter coefficients to reduce said second error signal.

The invention also includes a QAM demodulator including such an adaptive equaliser.

BRIEF DESCRIPTION OF THE DRAWINGS

FIGS. 3a, 3b and 3c illustrate sample error calculation using a slicer;

FIG. 7 illustrates a two stage adaptive equaliser; and

DETAILED DESCRIPTION

Figure 1:
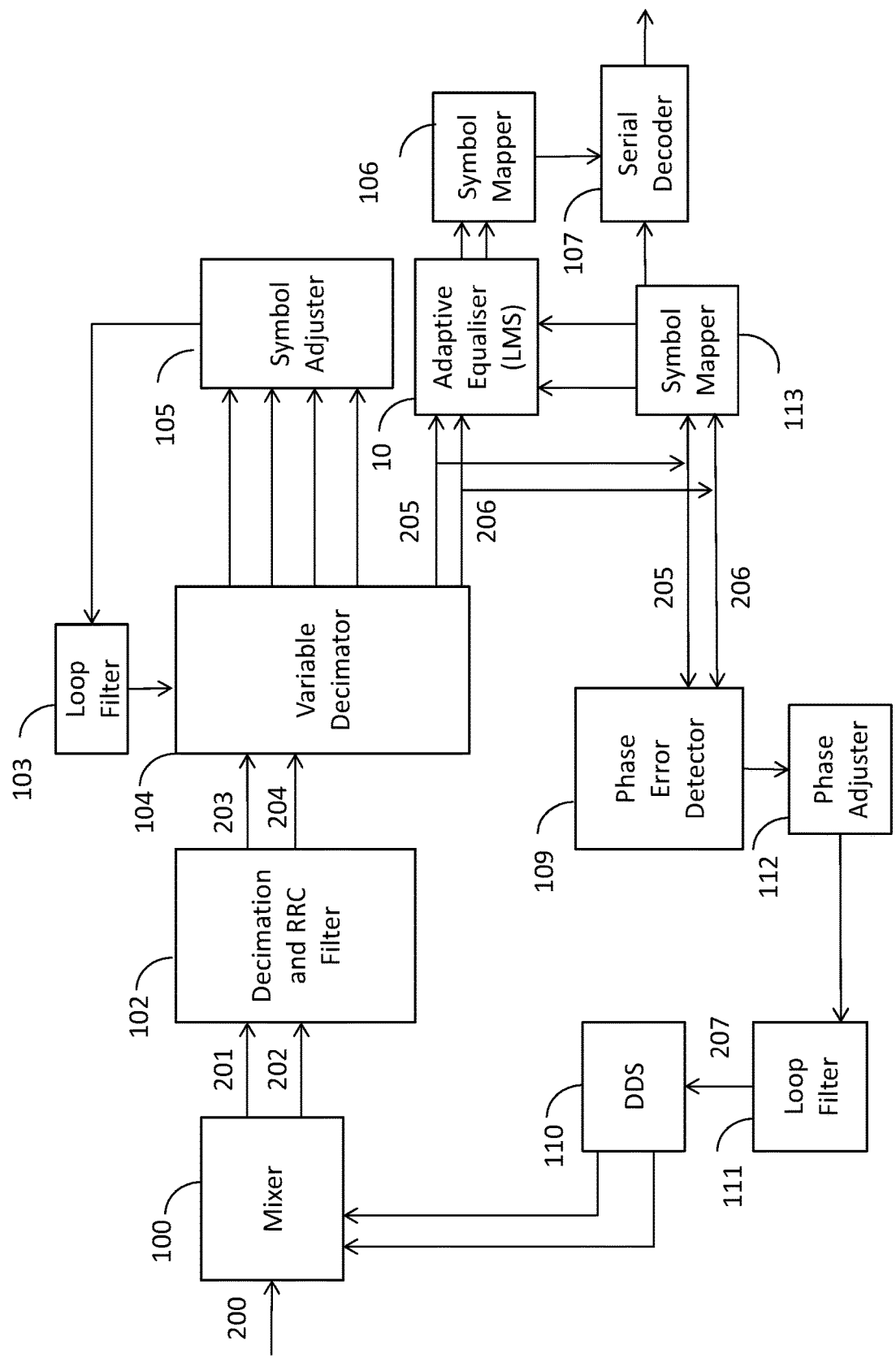
FIG. 1 is a block diagram showing a QAM demodulator with an adaptive equaliser.

FIG. 1 is a block diagram showing a QAM demodulator with an adaptive equaliser.

A mixer 100 receives an input signal 200 and generates inphase signal 201 and quadrature signal 202.

Signals 201, 202 are down converted by a decimation and RRC filter 102 to generate down converted inphase signal 203 and down converted quadrature signal 204.

A variable decimator 104, a symbol adjuster 105 and a loop filter 103 are used to detect the symbol timing error and sample the symbol at the ideal point to generate inphase symbol sample 205 and quadrature symbol sample 206.

Symbol samples 205, 206 are processed by a phase error detector 109, a phase adjuster 102 and a loop filter 111 to determine a correction value 207 for use by a digital direct synthesiser (DDS) 110. The DDS 110 generates a carrier frequency to feed to the mixer 100.

The symbol sample 205, 206 are processed by a symbol mapper 113 prior and equalised by adaptive equaliser 10 (which will be described in more detail later). Such symbol mappers are also referred to herein as 'slicers' and mapping of a received symbol to the closest symbol is often referred to as 'slicing'. After equalisation by the adaptive equaliser 10 symbol values are processed by a second symbol mapper 106 and a serial decoder 107 to a serial bit stream.

Figure 2:
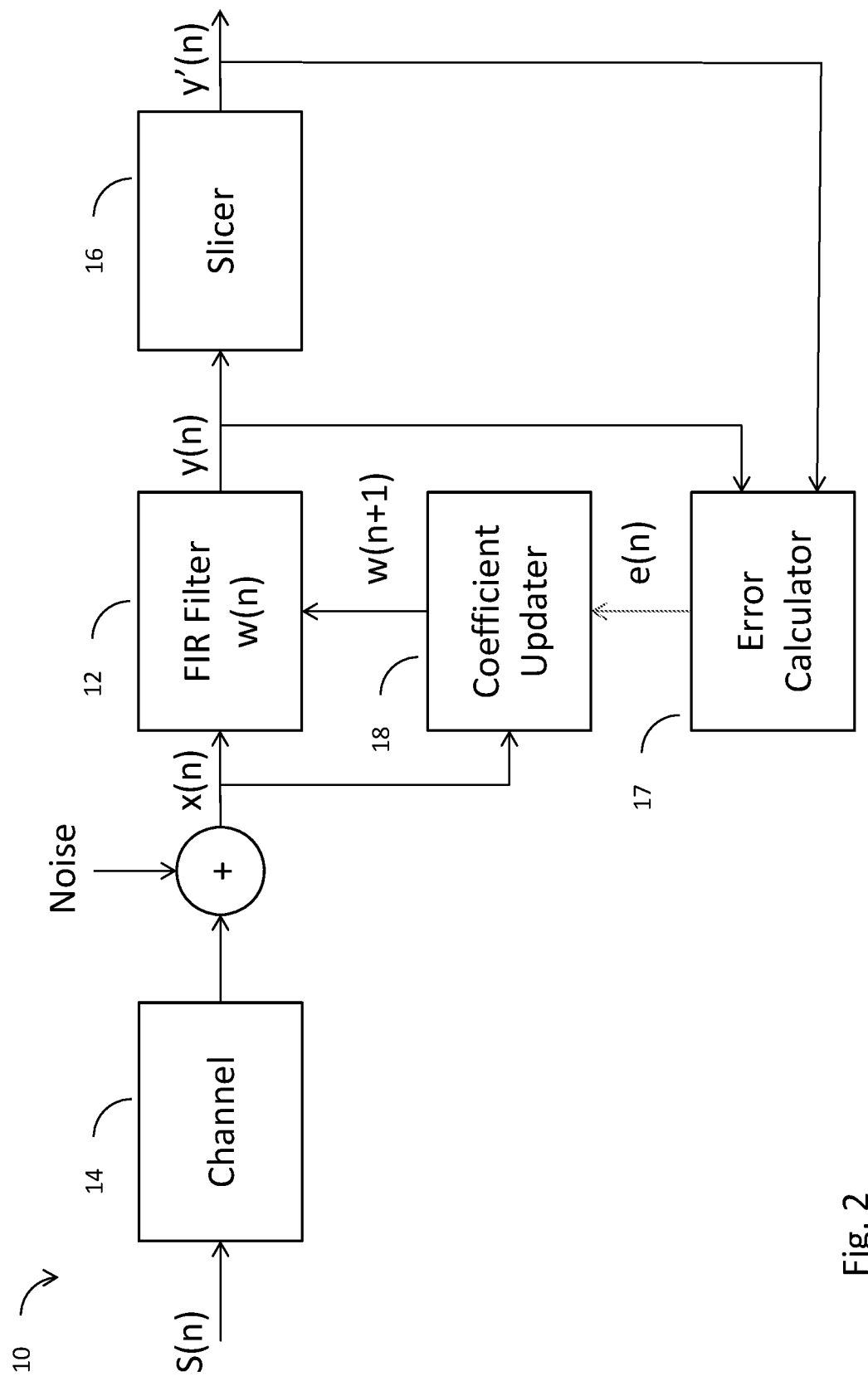
FIG. 2 illustrates a conventional adaptive equaliser.

FIG. 2 illustrates a conventional adaptive equaliser. It is to be noted that the terms adaptive equaliser and adaptive filter are used synonymously in the following description.

An adaptive equaliser 10 adjusts filter coefficients of a finite impulse response (FIR) filter 12 based upon the difference between ideal sample values y'(n) and the sample values y(n) output by the filter 12.

A signal S(n) is distorted by distortions introduced by a channel 14 and/or by noise to produced received signal x(n). The received signal x(n) is processed by the FIR filter 12 having coefficients w(n) to produce signal y(n) according to the convolution equation:

$$y(n)=x(n)*w(n)$$

The resulting signal y(n) is then processed by a slicer 16 as shown in FIGS. 3a, 3b and 3c.

FIG. 3a is a constellation diagram illustrating a received symbol 21, together with a 'target' symbol 20 representing the transmitted symbol. Vector 22 represents the difference between the two symbols otherwise know as the modulation error.

In FIG. 3b a target symbol 23 is represented by inphase and quadrature components of 80. The received symbol 24 has and inphase component 25 $I_{sample}$ equal to 85 and a quadrature component 26 $Q_{sample}$ equal to 77. Slicer 16 receives the inphase and quadrature components 25, 26 and determines the target inphase component I' and target quadrature component Q' of the appropriate target symbol 23 from the received symbol 24 using a conventional least mean squares (LMS) algorithm.

Error Calculator 17 then produces error signal e(n) based upon a calculation of the difference between the received symbol 24 and the target symbol 23:

$$e(n)\_I=I_{sample}-I'$$

$$e(n)\_Q=Q_{sample}-Q'$$

Coefficient Updater 18 then updates the coefficients of the FIR filter 12 according to the equation:

$$w(n+1)=w(n)+u*e(n)*x(n)$$

where 'u' is a step size chosen such that 0<u<1/input signal power multiplied by the no. of filter taps.

Figure 4B:
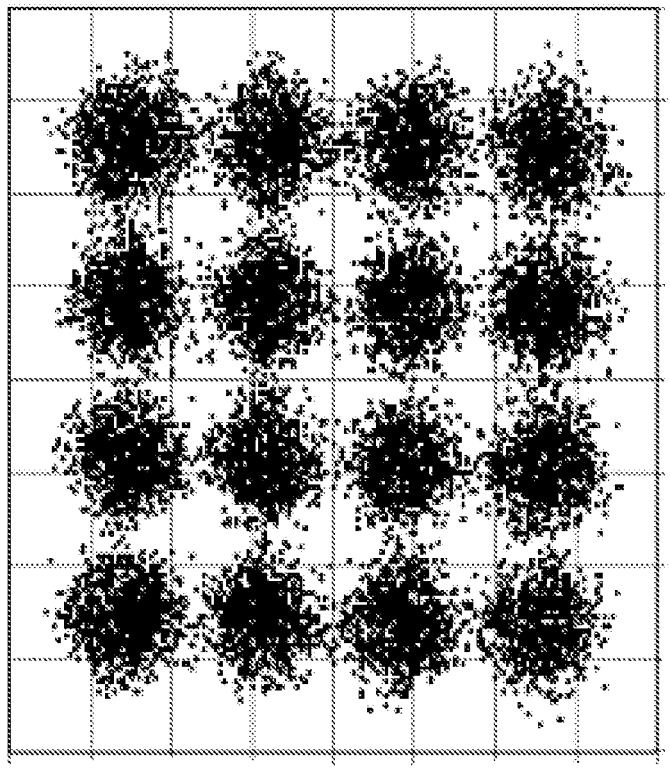
FIGS. 4a and 4b illustrate an equalised QPSK constellation and QAM16 constellation from a signal received over a distorted channel or noisy environment.
Figure 4A:
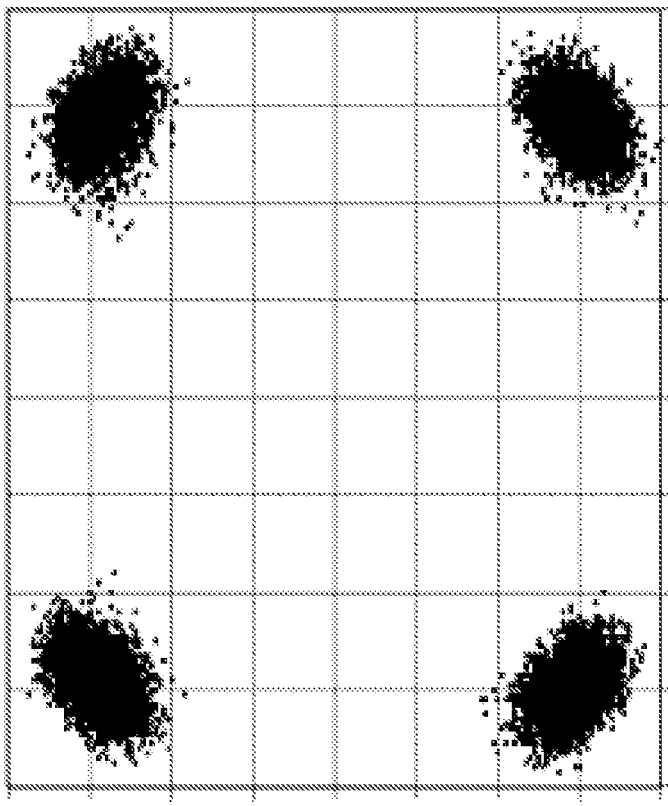

FIGS. 4a and 4b are constellation diagrams illustrating equalized QPSK and QAM16 signals respectively using a conventional adaptive equaliser as illustrated in FIG. 1 for signals sent over the same channel as each other.

As can be seen on FIG. 3a, QPSK constellation points do not overlap with adjacent constellation points. There is clear boundary between the 4 regions of constellation points. From QPSK modulation we could measure the sample error values on all points.

However, for the same channel with a QAM 16 signal, the constellations overlap with adjacent constellation points as shown in FIG. 4b. Therefore when these points are processed by the slicer 16 they will be misidentified and the sample errors will be incorrect because ideal sample is from adjacent constellation point. If the percentage of symbols which are misidentified is greater than 10% adaptive equalization will not converge and becomes unstable.

An improved adaptive equalisation scheme will now be described with reference to FIGS. 5 to 8.

Figure 5:
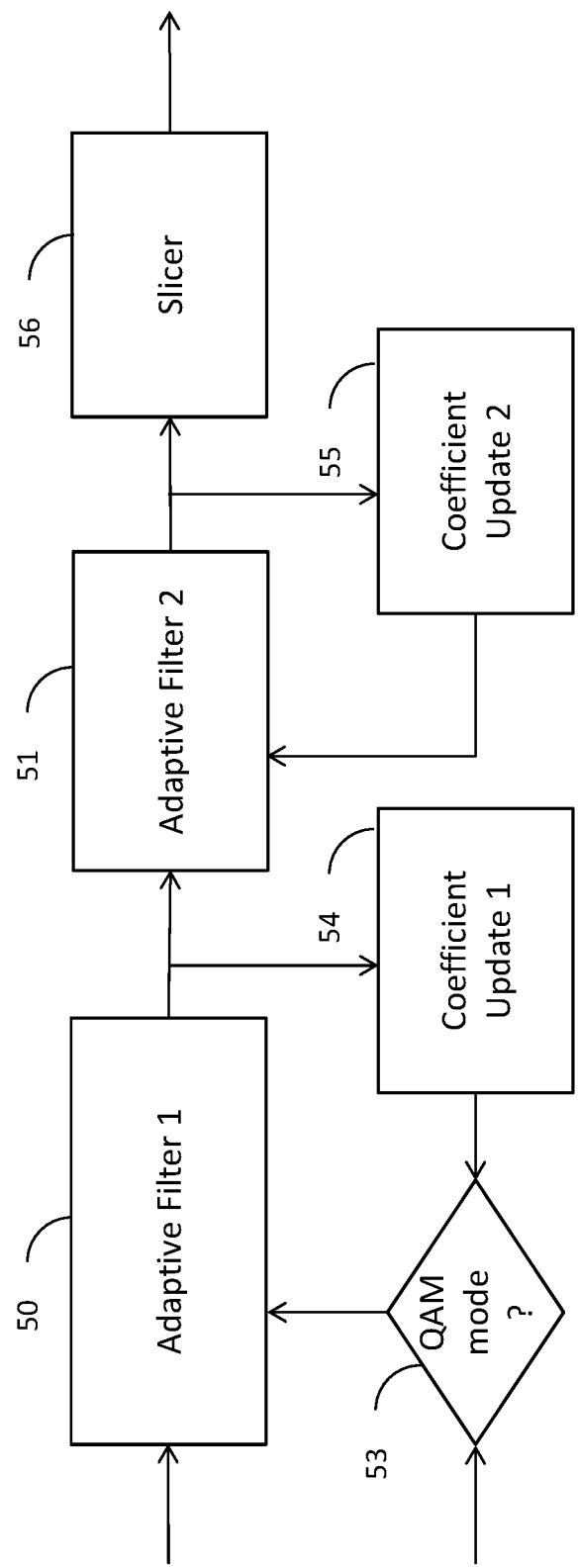
FIG. 5 illustrates a two stage adaptive equaliser.
Figure 6:
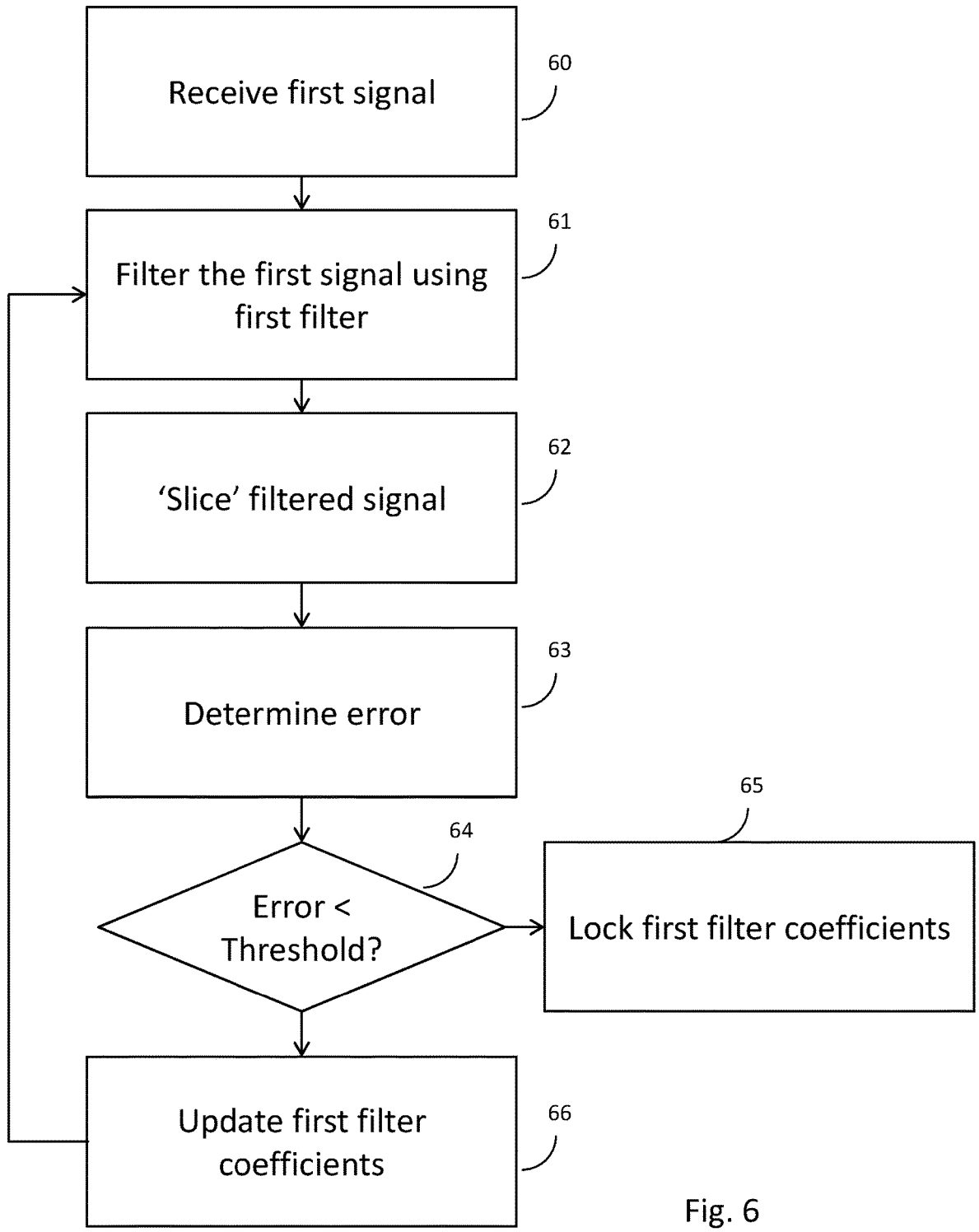
FIG. 6 is a flow chart illustrating steps in a method according to the present invention.

Referring to FIGS. 5 and 6 at step 60 a first signal is received via a channel by a first adaptive equaliser 50. The received signal differs from the transmitted signal due to channel distortion and/or noise. The signal comprises a sequence of symbols encoded by inphase and quadrature components, for example the signal may be a QPSK or QAM16 encoded signal as is well known in the art. In the preferred embodiment the signal is a QPSK signal.

In the preferred embodiment the module starts in 100 kbps bandwidth mode by default. This corresponds to QPSK modulation. When the system is started up the channel conditions are unknown and using QPSK modulation the chance of adaptive equalisation convergence to correct filter coefficients is much better than when using a higher order modulation schemes such as QAM16, QAM64. However if it is believed the channel conditions are good enough it is possible to start with a higher order modulation. The first modulation/bandwidth mode will be referred to below as the initial modulation. The subsequent modulation mode is one in which the number of bits encoded by the symbols of the first signal is fewer than the number of bits encoded by the symbols of the second signal.

At step 61 a portion of the received first signal using a first filter, such as a conventional FIR filter having a plurality of first filter coefficients. Such filtering is conventionally represented by the convolution equation $$y(n)=x(n)*w(n)$$

as described previously where x(n) represent the first signal, w(n) represents the filter coefficients and y(n) represents the filtered signal.

At step 62 the filtered signal is 'sliced' within a first coefficient updater 54 to determine the likely inphase and quadrature components of the originally transmitted signal as described above with reference to FIGS. 2a, 2b and 2c.

At step 63 the difference between the likely (sometimes called the 'ideal') inphase and quadrature components of the originally transmitted signal and the filtered signal is calculated by the first coefficient updater 54 to produce an error signal e(n).

If the error is less than a predetermined threshold at step 64 then if the and the QAM mode is determined by a decision module 53 to be equal to the initial modulation the first filter coefficients are locked at step 65. Otherwise the first filter coefficients are updated at step 66 as described previously with reference to coefficient updater 18.

Steps 61 to 64 are repeated until the coefficients are locked at step 65.

Figure 7:
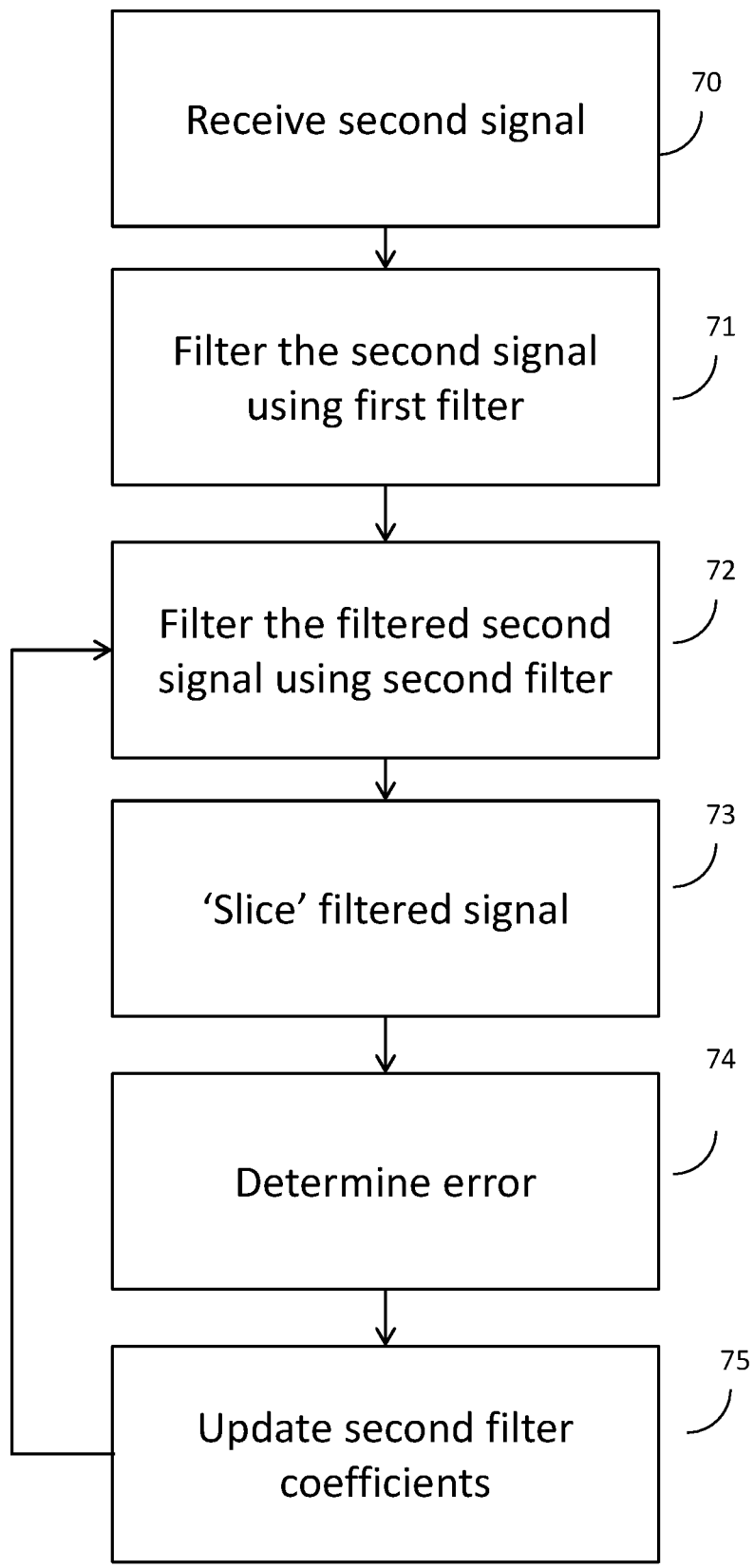
FIG. 7 is a flow chart illustrating further steps in a method according to the present invention.

FIG. 7 illustrates the method steps that are carried out after the first filter coefficients in the first adaptive equaliser have been locked.

At step 70 a second signal is received via a channel. The received signal differs from the transmitted signal due to channel distortion and/or noise. The signal comprises a sequence of symbols encoded by inphase and quadrature components, for example the signal may be QAM16 or higher order QAM encoded signal as is well known in the art. In the preferred embodiment the signal is a QAM16 signal. The number of bits encoded by the symbols of the first signal is fewer than the number of bits encoded by the symbols of the second signal ie the second signal is a higher order QAM signal than the first signal which was used to lock the filter of the first adaptive equaliser.

At Step 71 the signal is filtered by the first adaptive filter 50 which now has the coefficients locked.

Figure 8:
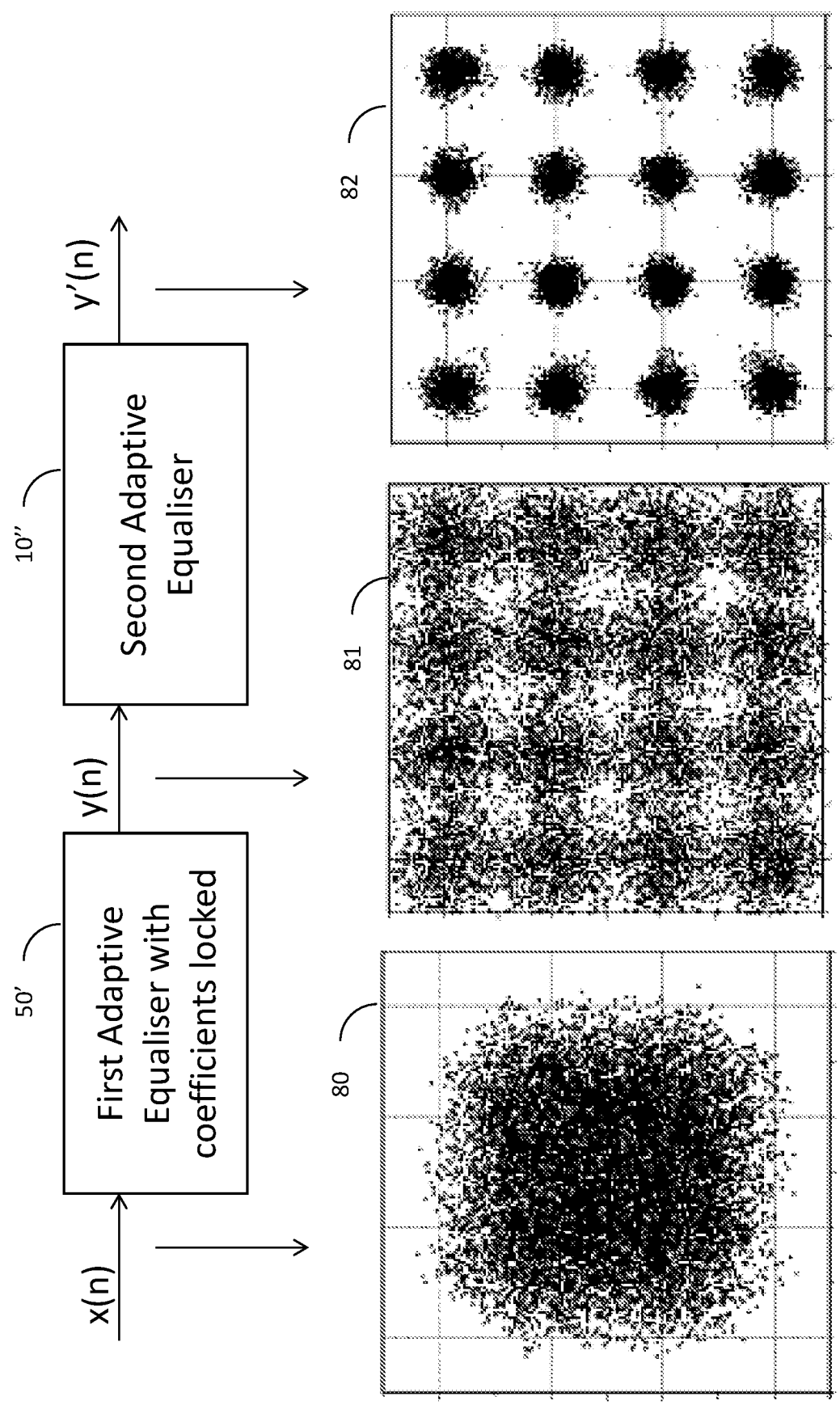
FIG. 8 illustrates constellation diagrams of the signal before and after each stage of adaptive equalisation.

FIG. 8 shows QAM16 modulation using a first adaptive equaliser 50' having a FIR filter which has been locked. Before entering QAM 16 mode the QPSK modulation has been able to obtain good convergence of the filter's coefficients for the filter.

It can be seen that the constellation 80 of the second received signal QAM16 is severely affected by noise and Channel distortions. The signal degradation is worse than that of shown in FIG. 8a.

The signal is filter by the filter of the first adaptive equaliser. A constellation diagram 81 of the output signal y(n) is shown. This filtered signal is then processed by a second adaptive equaliser 10" in the conventional way as follows:

At step 72 the filtered second signal is filtered using a second adaptive filter 51 having a plurality of second filter coefficients.

At step 73 the filtered signal is 'sliced' in a second coefficient updater 55 to determine the likely inphase and quadrature components of the originally transmitted signal as described above with reference to FIGS. 2a, 2b and 2c.

At step 74 the difference between the likely (or ideal) inphase and quadrature components of the originally transmitted signal and the filtered signal is calculated by the second coefficient updater 55 to produce a (second) error signal e'(n).

At step 75 the (second) error signal e'(n) is used by the second coefficient updater to update the second filter coefficients:

$$w'(n+1)=w'(n)+u'^*e'(n)*y(n)$$

A constellation diagram 82 of the output signal y'(n) from the second adaptive filer 51' is shown in FIG. 8.

By applying this scheme 200 kbps and 300 kbps bandwidths may be achieved on channels with severe channel distortions and/or severe noise.

It is to be recognised that various alterations, modifications, and/or additions may be introduced into the constructions and arrangements of parts described above without departing from the scope of the present invention as defined in the following claims.

The invention claimed is:

1. A method of adaptive equalisation comprising the steps of:
   receiving a first signal via a channel in which the received first signal differs from a transmitted first signal due to channel distortion and/or noise, the transmitted first signal comprising a sequence of first symbols encoded by first inphase and quadrature components;
   repeating the steps of
   filtering a portion of the received first signal using a first filter having a plurality of first filter coefficients to obtain filtered first inphase and quadrature components of the received first signal;
   determining the first inphase and quadrature components of the transmitted first signal;
   determining a first error signal in dependence upon a first difference between the first inphase and quadrature components of the transmitted first signal and the filtered first inphase and quadrature components of the received first signal;

updating the first filter coefficients to reduce said determined first error signal to create a reduced first error signal; and locking said first filter coefficients when the reduced first error signal is less than a predetermined threshold;

and the method further comprises receiving a second signal via the channel in which the received second signal differs from a transmitted second signal due to the channel distortion and/or noise, the transmitted second signal comprising a sequence of second symbols encoded by second inphase and quadrature components;

continually repeating the steps of filtering a portion of the received second signal using said first filter with said locked first filter coefficients to obtain a first filtered received second signal;

filtering the first filtered received second signal using a second filter having a plurality of second filter coefficients to obtain filtered second inphase and quadrature components of the received second signal;

determining the second inphase and quadrature components of the transmitted second signal;

determining a second error signal in dependence upon a second difference between the second inphase and quadrature components of the transmitted second signal and the filtered second inphase and quadrature components of the received second signal;

updating the second filter coefficients to reduce the determined second error signal to create a reduced second error signal; and wherein a number of bits encoded by the first symbols of the transmitted first signal in an initial modulation mode is fewer than a number of bits encoded by the second symbols of the transmitted second signal in a subsequent modulation mode.

2. The method according to claim 1, in which the transmitted first signal comprises a QPSK signal.

3. The method according to claim 1, in which the transmitted second signal is a QAM 16 signal.

4. The method according to claim 1, in which the first inphase and quadrature components of the transmitted first signal and the second inphase and quadrature components of the transmitted second signal are determined by using a least means squares algorithm.

5. The method according to claim 1, in which the first filter coefficients and the second filter coefficients are updated in dependence upon the determined first error signal and the determined second error signal respectively together with a factor which is greater than zero and less than 1/input signal power multiplied by a number of filter taps in the respective first filter or second filter.

6. An apparatus for receiving data signals from a telemetry module comprising:

a first adaptive equaliser configured to receive a first signal transmitted via a channel in which the received first signal differs from a transmitted first signal due to channel distortion and/or noise, the transmitted first signal comprising a sequence of first symbols encoded by first inphase and quadrature components;

the first adaptive equaliser comprising:

a first filter configured to filter a portion of the received first signal using the first filter having a plurality of first filter coefficients to obtain received first inphase and quadrature components of the received first signal;

a first slicer configured to determine the first inphase and quadrature components of the transmitted first signal;

a first error calculator configured to determine a first error signal in dependence upon a first difference between the first inphase and quadrature components of the transmitted first signal and the received first inphase and quadrature components of the received first signal; and a first coefficient updater configured to:

update the first filter coefficients to reduce said first error signal and to lock said first filter coefficients when the first error signal is less than a predetermined threshold;

the first filter being further configured, once the first filter coefficients are locked, to receive and filter a second signal transmitted by the channel in which the received second signal differs from a transmitted second signal due to the channel distortion and/or noise, the transmitted second signal comprising a sequence of second symbols encoded by second inphase and quadrature components; and a second adaptive equaliser configured to receive a filtered second signal from the first filter, the second adaptive equaliser comprising:

a second filter configured to filter a portion of the filtered second signal received from the first filter using a second filter having a plurality of second filter coefficients to obtain received second inphase and quadrature components of the received second signal;

a second slicer configured to determine the second inphase and quadrature components of the second transmitted signal;

a second error calculator configured to determine a second error signal in dependence upon a second difference between the second inphase and quadrature components of the second transmitted signal and the received second inphase and quadrature components of the received second signal; and a second coefficient updater configured to update the second filter coefficients to reduce said second error signal.

7. The apparatus according to claim 6, in which the transmitted first signal comprises a QPSK signal.

8. The apparatus according to claim 6, in which the transmitted second signal is a QAM 16 signal.

9. The apparatus according to claim 6, in which the first error calculator is configured to determine the first inphase and quadrature components of the transmitted first signal using a least means squares algorithm.

10. The apparatus according to claim 6, in which the first and second coefficient updaters are configured to update the first filter coefficients and the second filter coefficients respectively in dependence upon the first error signal and the second error signal respectively together with a factor which is greater than zero and less than 1/input signal power multiplied by a number of filter taps in the respective first filter or second filter.

* * * * *